United States Patent
Takabatake

(10) Patent No.: US 7,053,600 B2
(45) Date of Patent: May 30, 2006

(54) CURRENT SENSOR

(75) Inventor: Naritomo Takabatake, Koriyama (JP)

(73) Assignee: Victor Company of Japan, LTD, Yokohama (JP)

( * ) Notice: Subject to any disclaimer, the term of this patent is extended or adjusted under 35 U.S.C. 154(b) by 0 days.

(21) Appl. No.: 10/874,314

(22) Filed: Jun. 24, 2004

(65) Prior Publication Data

US 2004/0263148 A1    Dec. 30, 2004

(30) Foreign Application Priority Data

Jun. 27, 2003    (JP)    ............................ 2003-184505
May 11, 2004    (JP)    ............................ 2004-141002

(51) Int. Cl.
*G01R 33/02*    (2006.01)

(52) U.S. Cl. ................................. 324/117 H

(58) Field of Classification Search ............ 324/117 H, 324/117 R, 251, 252; 338/32 H, 32 R; 323/368, 323/294; 310/314, 315; 330/6, 252, 256

See application file for complete search history.

(56) References Cited

U.S. PATENT DOCUMENTS

| 4,687,994 A | * | 8/1987 | Fulkerson et al. | .......... 324/251 |
| 4,833,406 A | * | 5/1989 | Foster | ................ 324/225 |
| 5,065,088 A | * | 11/1991 | Habiro et al. | ........... 324/117 H |

FOREIGN PATENT DOCUMENTS

JP    2003-014788    1/2003

* cited by examiner

*Primary Examiner*—Zandra V. Smith
*Assistant Examiner*—Roberto Velez
(74) *Attorney, Agent, or Firm*—Jacobson Holman PLLC

(57) ABSTRACT

A current sensor has a Hall element, a differential amplifier that amplifying an output voltage of the Hall element, thus producing a sensor output voltage, and a compensation circuit that compensates for variation in offset voltage of the current sensor. The compensation circuit has a plurality of series-connected diodes each exhibiting specific temperature characteristics based on a gradient of an approximated straight line given by a relationship between a residual Hall voltage of the Hall element at a given temperature and a rate of change in the residual Hall voltage due to temperature change, to produce a compensation voltage in accordance with the temperature characteristics. The compensation voltage is added to the output voltage of the Hall element and input to the differential amplifier.

4 Claims, 5 Drawing Sheets

CURRENT SENSOR

BACKGROUND OF THE INVENTION

The present invention relates to a current sensor equipped with a Hall element or device.

Current sensors for detecting DC (direct) currents have been widely used in a variety of fields, such as, home electric appliances (air conditioners, automatic washing machines, sewing machines, etc.), industrial equipment and transportation equipment (automobiles, railcars, vessels, etc.).

There is a strong demand for current sensors that are inexpensive but can accurately detect currents in a wide range of temperature.

For such purposes, most current sensors are usually equipped with Hall elements or MR (magnetoresistive) elements for detecting currents. Hall elements are more popular than MR elements for cost performance.

Current sensors equipped with Hall elements are, however, prone to errors caused by change in sensitivity in accordance with change in temperature due to peculiar characteristics of each Hall element.

Moreover, these current sensors suffer generation of an offset voltage (corresponding to a residual Hall voltage multiplied by an amplifier gain) even if no current is detected. The offset voltage depends on variation in the characteristics of each Hall element, temperature change, etc.

There are several types of current sensors having circuitry for canceling the offset voltage.

The inventor of the present invention disclosed one of such types of current sensors in Japanese Un-examined Patent publication No. 2003-14788.

The current sensor is equipped with a Hall element, a differential amplifier and a compensation differential amplifier.

A voltage drop across the internal resistance of the Hall element, which varies in accordance with change in temperature, is supplied to the compensation differential amplifier. The voltage drop is multiplied by a compensation gain p and then output from the compensation differential amplifier. The output is subtracted from the output of the differential amplifier, thus a current-sensor output voltage being produced.

The cost performance of this current sensor is, however, relatively low, because the sensor requires the differential amplifier and the compensation differential amplifier.

There is thus a strong demand for a current sensor that can cancel the drift of offset voltage caused by temperature change with simple and low-cost circuit configuration.

SUMMARY OF THE INVENTION

A purpose of the present invention is to provide a highly-accurate current sensor that can cancel the drift of offset voltage caused by temperature change with simple and low-cost circuit configuration.

The present invention provides a current sensor comprising: a Hall element; a differential amplifier to amplify an output voltage of the Hall element, thus producing a sensor output voltage; and a compensation circuit to compensate for variation in offset voltage of the current sensor, the compensation circuit having a plurality of series-connected diodes each exhibiting specific temperature characteristics based on a gradient of an approximated straight line given by a relationship between an residual Hall voltage of the Hall element at a given temperature and a rate of change in the residual Hall voltage due to temperature change, thus producing a compensation voltage in accordance with the temperature characteristics, the compensation voltage being added to the output voltage of the Hall element and input to the differential amplifier.

DETAILED DESCRIPTION OF PREFERRED EMBODIMENT

An embodiment according to the present invention will be disclosed with reference to the attached drawings.

The current sensor according to the present invention is equipped with a Hall element, a differential amplifier and a compensation circuit. The Hall element is not molded or enclosed by a substance that generates no stress due to temperature change. The compensation circuit compensates for the drift of offset voltage due to temperature change with bias-voltage adjustments to the input of the differential amplifier based on the correlation between change in residual Hall voltage due to temperature change and the residual Hall voltage at almost room temperature (such as 0° C. or 25° C.), and also the temperature characteristics of diode forward voltage.

Figure 1A:
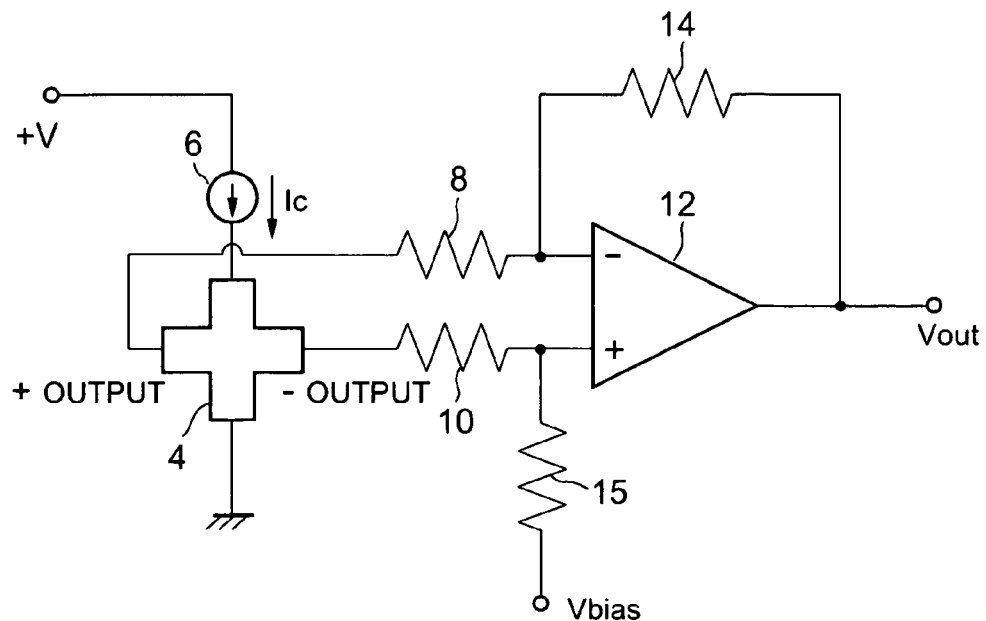
FIGS. 1A and 1B show a circuit block diagram of a preferred embodiment of a current sensor according to the present invention.
Figure 1B:
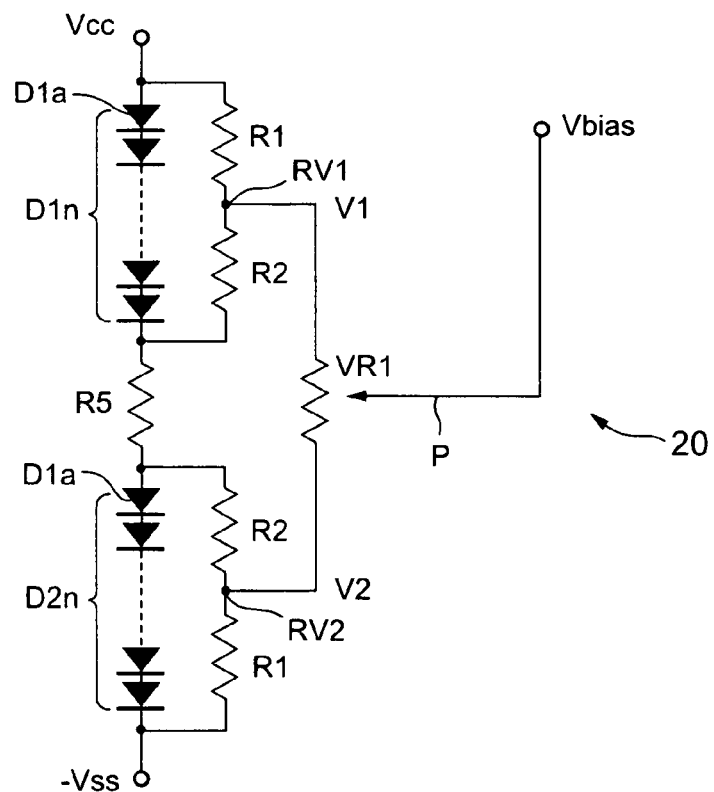

Shown in FIGS. 1A and 1B is an embodiment of a current sensor according to the present invention.

Input to a Hall element 4 in one direction is a constant current Ic supplied from a constant current source 6. The outputs of the Hall element 4 in another direction perpendicular to the former direction are supplied to a differential amplifier 12 via input resistors 8 and 10. In detail, the "+"-output of the Hall element 12 is supplied to the "−"-input of the differential amplifier 12 whereas the "−"-output of the former is supplied to the "+"-input of the latter.

A feedback resistor 14 is connected across the output and the "−"-input of the differential amplifier 12.

A compensation circuit 20, such as shown in FIG. 1B, is connected to a compensation-voltage terminal Vbias between the input resistor 10 and the "+"-input of the differential amplifier 12, via a resistor 15.

As shown in FIG. 1B, the compensation circuit 20 is equipped with a first diode group D1 of "n" number of series-connected diodes D1a and a second diode group D2 of the same "n" number of series-connected diodes D1a, both groups being connected in series via a resistor R5 between constant voltages +Vcc and −Vss (or GND).

Series-connected resistors R1 and R2 are connected in parallel across each of the diode groups D1 and D2. Connected between the resistors R1 and R2 for the diode group D1 is a fixed terminal RV1 of a 3-terminal variable resistor VR1. Connected between the resistors R1 and R2 for the diode group D2 is another fixed terminal RV2 of the variable resistor VR1. A variable terminal P of the variable resistor VR1 is connected to compensation-voltage terminal Vbias.

Figure 2:
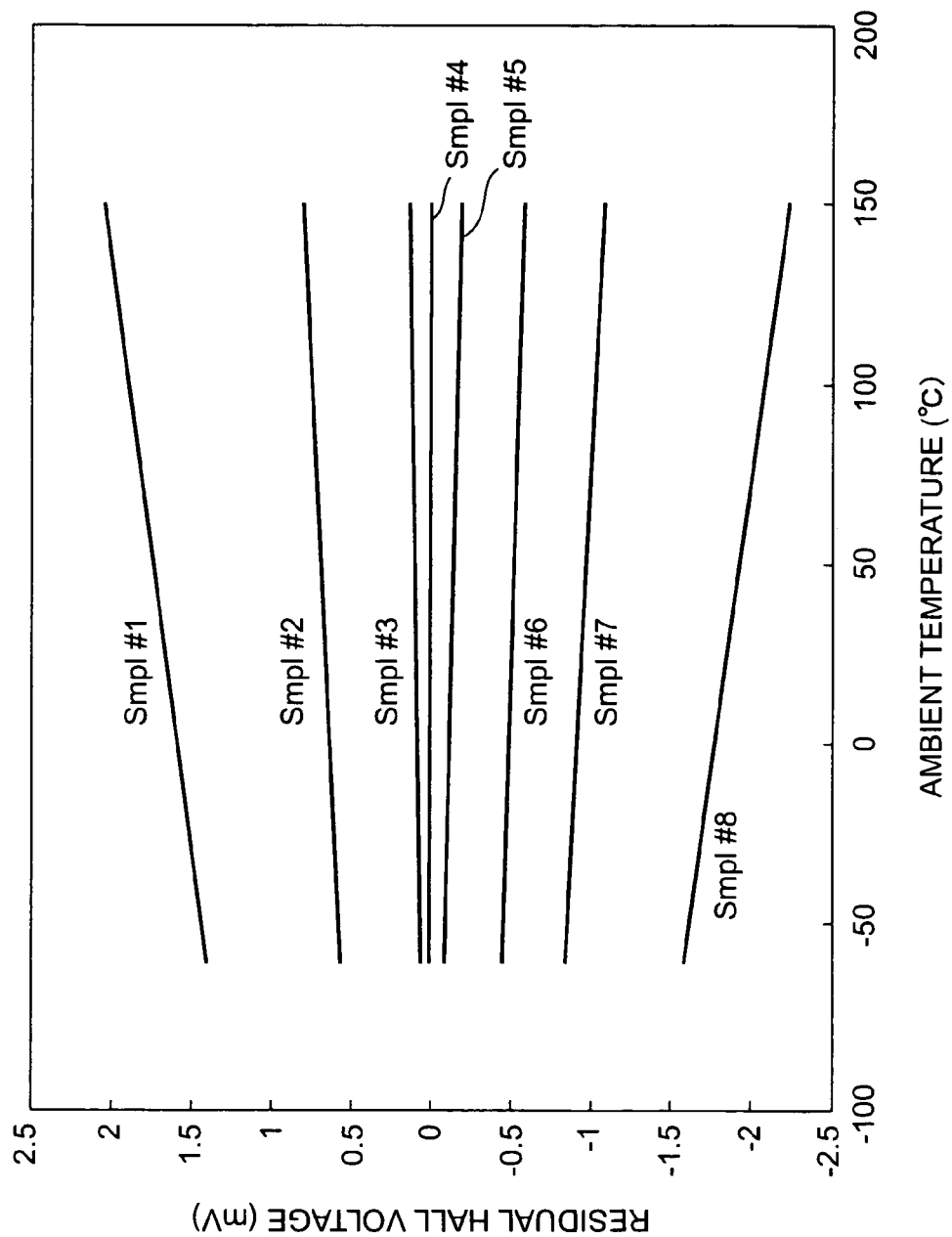
FIG. 2 show several graphs of the temperature characteristics of residual Hall voltage for Hall elements which exhibit no stress change due to temperature change.

Discussed next with reference to FIG. 2 is a method of compensating for the drift of offset voltage caused by temperature change, in this embodiment.

FIG. 2 shows the relationship between the residual Hall voltage and ambient temperature of the Hall element 4. In detail, shown in FIG. 2 are eight approximated straight lines based on residual Hall voltages actually measured for eight sample Hall elements (SAMPLE #1 to SAMPLE #8) used as the Hall element 4 in FIG. 1A, when 1 mA-DC current was input to each sample.

FIG. 2 teaches that linear approximation can be applied to the relationship with approximation equations for the eight sample Hall elements as follows:

SAMPLE #1: $y = 0.0029x + 1.5883$ (A)

SAMPLE #2: $y = 0.0011x + 1.6353$

SAMPLE #3: $y = 0.0004x + 1.0687$

SAMPLE #4: $y = -4E - 05x + 1.0002$

SAMPLE #5: $y = -0.0005x - 0.1276$

SAMPLE #6: $y = -0.0007x - 0.4929$

SAMPLE #7: $y = -0.0012x - 0.9034$

SAMPLE #8: $y = -0.0032x - 1.7648$

The compensation method in this embodiment is to make adjustments to the compensation bias voltage Vbias to vary the sensor output voltage Vout, thus canceling the offset voltage generated in the current sensor (FIG. 1A).

At a given constant bias voltage Vbias, when the residual Hall voltage appears at the positive ("+") side, like SAMPLE #1 to SAMPLE #3 in FIG. 2, at a given temperature, the sensor output voltage Vout becomes lower than when the residual Hall voltage is zero. This voltage drop Vd is given by multiplying the residual Hall voltage by the gain of the differential amplifier 12.

When the temperature rises from the given temperature, the residual Hall voltage increases along the temperature characteristics (FIG. 2) of each of the sample Hall elements SAMPLE #1 to SAMPLE #3, thus the sensor output voltage Vout further becomes lower.

Therefore, in this embodiment, the compensation bias voltage Vbias is increased in inverse proportional to the temperature characteristics of the sensor output voltage Vout so that both voltages balance out.

On the other hand, at a given constant bias voltage Vbias, when the residual Hall voltage appears at the negative ("-") side, like SAMPLE #5 to SAMPLE #8 in FIG. 2, at a given temperature, the sensor output voltage Vout becomes higher than when the residual Hall voltage is zero.

Therefore, in this embodiment, the compensation bias voltage Vbias is decreased in inverse proportional to the temperature characteristics of the sensor output voltage Vout so that both voltages balance out.

In order to achieve the compensation method described above, the compensation circuit 20 (FIG. 1B) is configured to make adjustments to the sensor output voltage Vout at temperatures at which linear approximation can be applied to the residual Hall voltage and to compensate for the drift of offset voltage due to temperature change.

Diodes are generally temperature-dependent for the forward voltage. In other words, the forward voltage of diodes decreases as the temperature rises.

Therefore, in the compensation circuit 20 shown in FIG. 1B, a voltage V1 at the fixed terminal TV1 increases whereas a voltage V2 at the fixed terminal TV2 decreases, as the as the temperature rises.

When the residual Hall voltage appears at the positive ("+") side at a given temperature (for example, the room temperature), like SAMPLE #1 to SAMPLE #3 in FIG. 2, the 3-terminal variable resistor VR1 is adjusted to the terminal VR1 side to increase the compensation bias voltage Vbias, as described above.

This adjustment offers the sensor output voltage Vout roughly the same as a voltage that could appear if an ideal Hall element giving zero volts in residual Hall voltage were used, at any given temperatures.

On the other hand, when the residual Hall voltage varies at the negative ("-") side at a given temperature (for example, the room temperature), like SAMPLE #5 to SAMPLE #8 in FIG. 2, the 3-terminal variable resistor VR1 is adjusted to the terminal VR2 side to decrease the compensation bias voltage Vbias, as described above.

This adjustment also offers the sensor output voltage Vout roughly the same as a voltage that could appear if an ideal Hall element giving zero volts in residual Hall voltage were used, at any given temperatures.

Moreover, the drift of residual Hall voltage of the Hall element 4 due to temperature change can be cancelled by making adjustments to the 3-terminal variable resistor VR1 (FIG. 1B) at a given temperature (for example, the room temperature) with adjustments to the resistance of the resistors R1 and R2, the forward voltage of the diodes D1a or the number "n" of the diodes D1a in each of the diode groups D1 and d2 so that the compensation bias voltage Vbias and the sensor output voltage Vout exhibit substantially the same temperature characteristics.

This cancellation of residual Hall voltage is achieved by utilizing the linear-approximation-applicable correlation between the residual Hall voltage at, for example, 25° C. and the rate of change (gradients) in residual Hall voltage due to temperature change.

Figure 3:
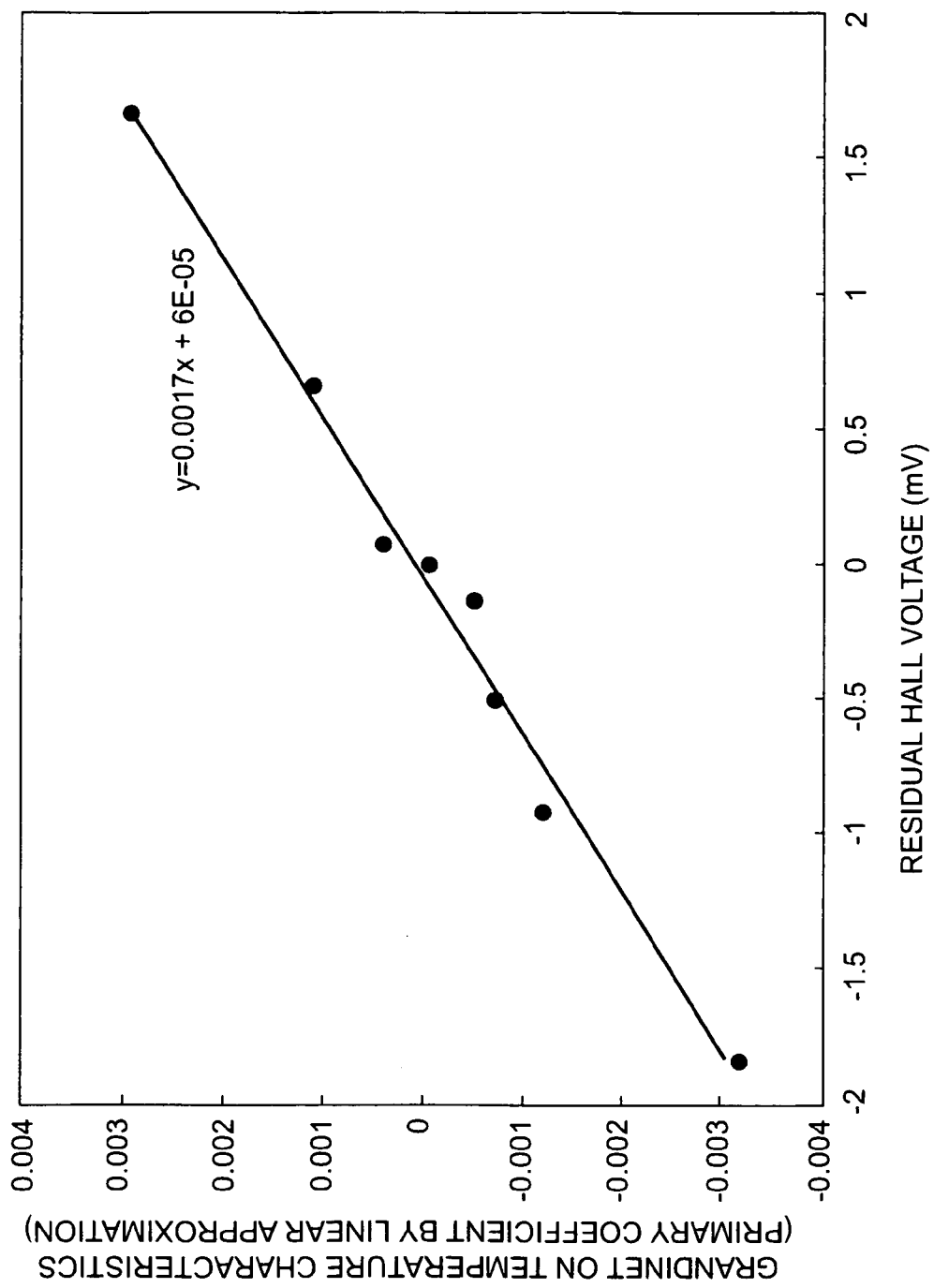
FIG. 3 shows a graph indicating correlation between residual Hall voltages and the temperature characteristics thereof at 25° C.

The correlation and linear approximation are discussed with respect to FIG. 3.

FIG. 3 shows an approximated straight line obtained by plotting residual Hall voltages Vo on the abscissa, which are given by substituting 25 (25° C.) for "x" in the eight approximation equations (A), and primary coefficients of the substituted approximation equations on the ordinate, and further applying linear approximation to the plotted values.

The compensation circuit 20 shown in FIG. 1B is thus configured so that it produces the compensation bias voltage Vbias exhibiting the gradient of the approximated straight line shown in FIG. 3 with adjustments to the resistance of the resistors R1 and R2, the forward voltage of the diodes D1a or the number "n" of the diodes D1a in each of the diode groups D1 and d2.

The embodiment of current sensor (FIGS. 1A and 1B) disclosed in detail can be easily configured with inexpensive circuit elements, for canceling the drift of offset voltage due to temperature change.

Figure 4:
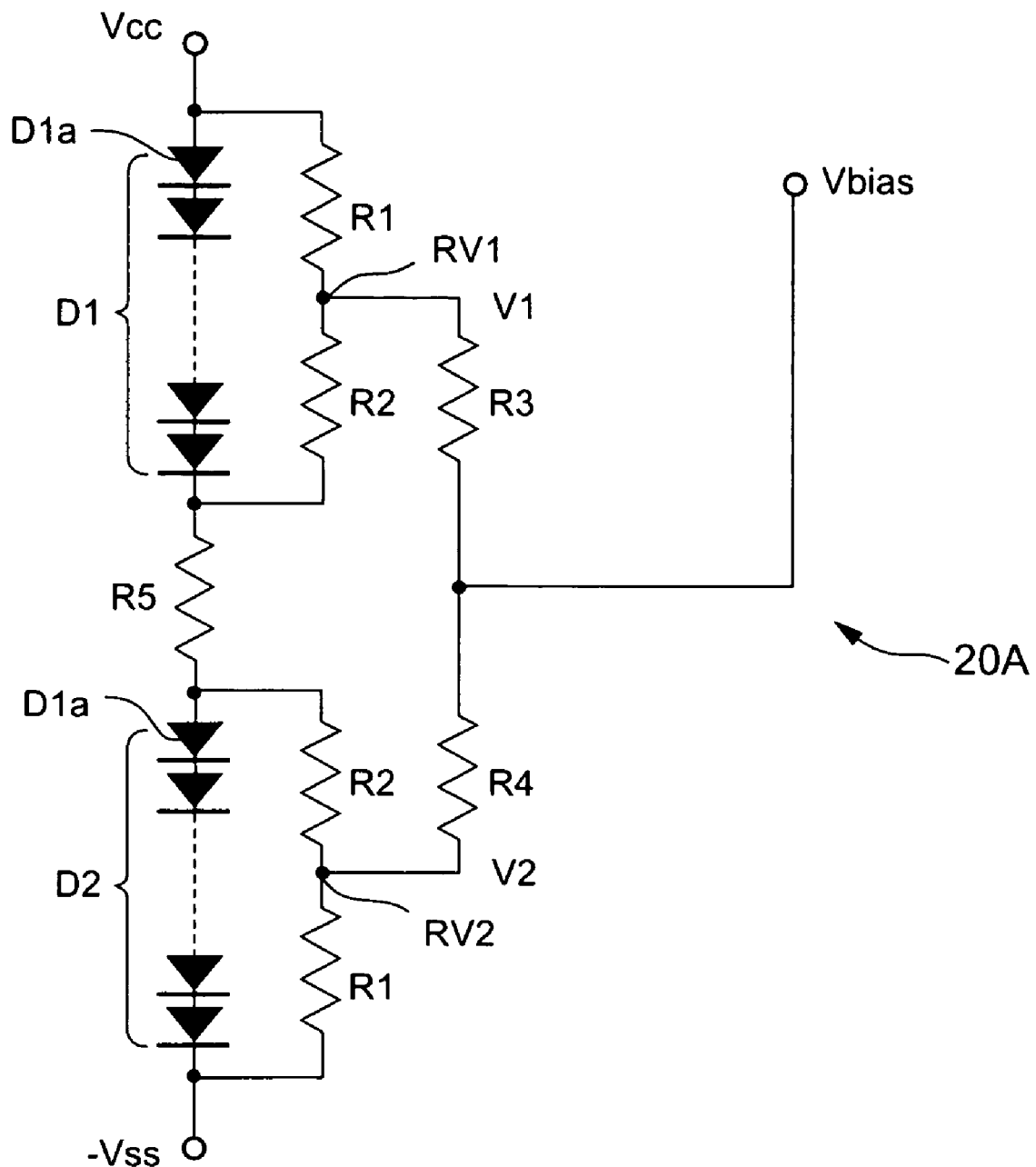
FIG. 4 shows a circuit block diagram of a modification to a compensation circuit shown in FIG. 1B.
Figure 5:
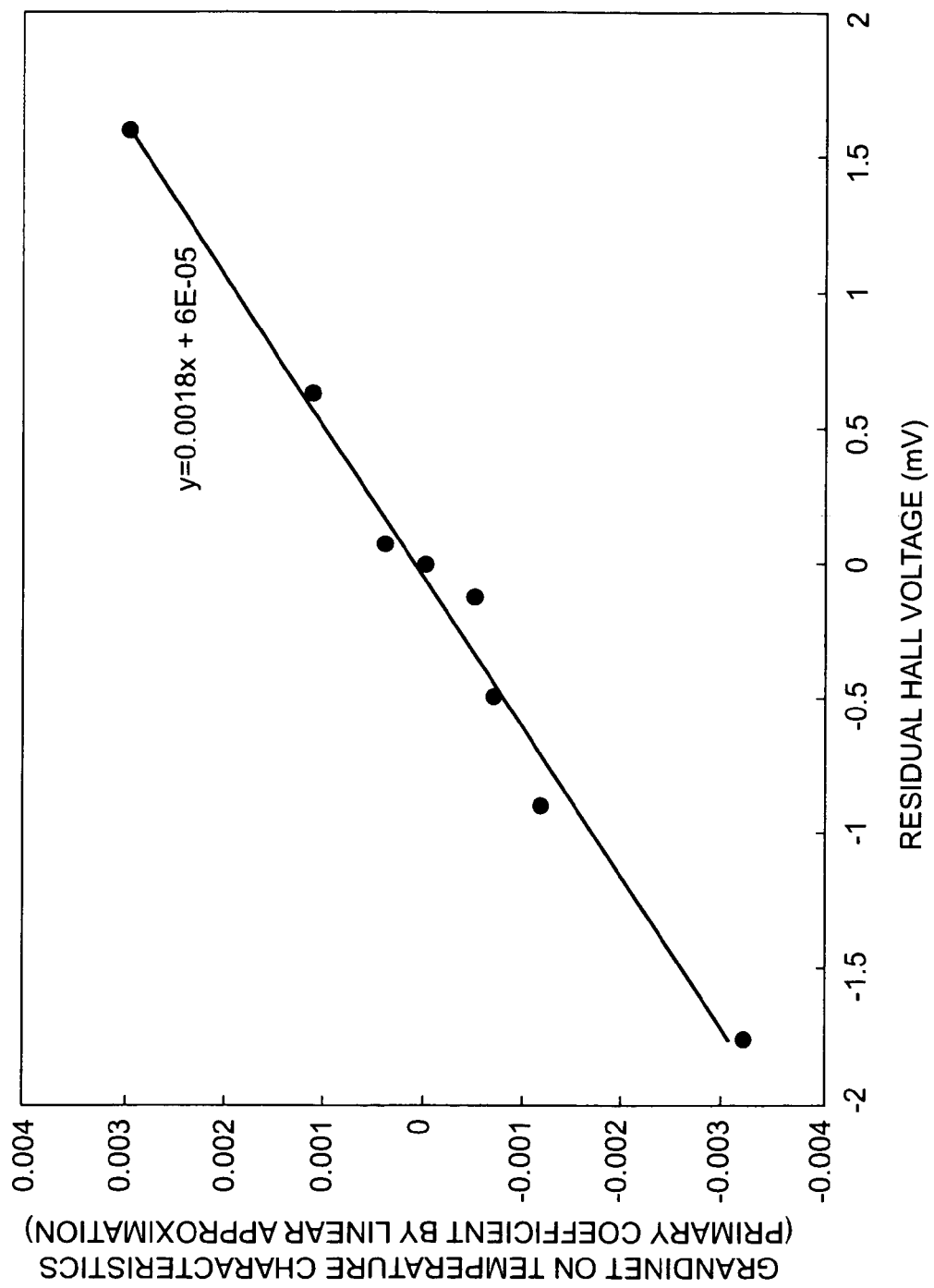
FIG. 5 shows a graph indicating correlation between residual Hall voltages and the temperature characteristics thereof at 0° C.

Disclosed next with respect to FIGS. 4 and 5 is a modification to the compensation circuit 20 shown in FIG. 1B.

The difference between the embodiment and the modification is that the former has the 3-terminal variable resistor VR1 whereas a compensation circuit 20A of the latter has fixed resistors R3 and R4. The other elements shown in FIG. 4 the same as or analogous to those shown in FIG. 1B are given the same reference signs.

Disclosed below is one way of selecting the resistors R1 to R4 in this modification under requirements: the temperature coefficient of the forward voltage Vd of each diode D1$a$ is much larger than that of each resistor; and variation in each resistor value due to temperature change is negligibly small. Diodes and resistors satisfying the requirements are used in the compensation circuit 20A.

[1] The relationship between the residual Hall voltage at the hall element 4 and the gradient on the temperature characteristics of this voltage are obtained from the characteristic curves measured for the eight sample Hall elements.

For simple calculation, the gradient a is calculated at the temperature 0° C. in FIG. 2. In detail, as shown in FIG. 5, plotted on the abscissa are residual Hall voltages Vo given by substituting 0 (0° C.) for "×" in the eight linear equations (A), and plotted on the ordinate are primary coefficients of the substituted approximation equations.

The gradient a is then given by the following equation (1).

$$\alpha = 0.0018 \times V_o(t=0) \tag{1}$$

where the unit of Vo is mV and (t=0) indicates the value at 0° C., the same being applied to the following several equations.

[2] The current Ic to be supplied to the Hall element 4 and the gain of the differential amplifier 12 are obtained.

The residual Hall voltages shown in FIG. 2 are given when 1 mA in DC current is supplied to the Hall element 4. The total gain $\beta$ is thus given by multiplying the gain of the differential amplifier 12 by the value of a current actually supplied to the Hall element 4, against 1 mA. The polarity of the total gain $\beta$ is negative (−) because the differential amplifier 12 is an inverse amplifier.

[3] The offset voltage Voff appearing as the sensor output Vout is given by the following equation (2), for determining the compensation bias voltage Vbias to adjust the sensor-output offset voltage Voff at 0° C.

$$V_{off}(t=0) = \beta \times V_o(t=0) \tag{2}$$

[4] The equation (2) is expressed as a function of temperature as follows:

$$V_{off}(t) = \beta \{0.0018 \times V_o(t=0) \times t + V_o(t=0)\} \tag{3}$$

[5] The equation (3) is differentiated with respect to the temperature "t".

$$\frac{dV_{off}}{dt} = 0.0018 \cdot \beta \cdot V_o(t=0) \tag{4}$$

The steps 1 to 5 disclosed above are the procedure to express in equation how the sensor output Vout is affected by the Hall-element residual Hall voltage and its temperature characteristics.

Disclosed next is how to determine the compensation bias voltage Vbias for compensating for those effects.

[6] The compensation bias voltage Vbias is given by the equation (5) shown below.

$$V_{bias} = \left(\frac{2R_4}{R_3+R_4} - 1\right) \cdot \left(V_{CC} - \frac{R_1}{R_1+R_2} \cdot n \cdot V_D\right) \tag{5}$$

where Vss=Vcc and, R3 and R4>>R1 and R2 in the modification shown in FIG. 4.

[7] The equation (5) is differentiated as a function of the temperature "t".

$$\frac{dV_{bias}}{dt} = -\left(\frac{2R_4}{R_3+R_4} - 1\right) \cdot \left(\frac{R_1}{R_1+R_2}\right) \cdot n \cdot \frac{dV_D}{dt} \tag{6}$$

[8] As disclosed above, adjustments to the current-sensor offset voltage Voff is performed by varying the compensation bias voltage Vbias in this modification. In other words, optimum temperature compensation is achieved by adjusting only the bias voltage Vbias when this bias voltage and the offset voltage Voff meet the following equation (7).

$$V_{off} : \frac{dV_{off}}{dt} = -V_{bias} : \frac{dV_{bias}}{dt} \tag{7}$$

The equation (7) is put into the following equation (8).

$$\frac{\frac{dV_{off}}{dt}}{V_{off}} = -\frac{\frac{dV_{bias}}{dt}}{V_{bias}} \tag{8}$$

where the current-sensor offset voltage Voff and the compensation bias voltage Vbias are voltages at the same temperature (0° C. in this case).

[9] The left side of the equation (8) is calculated as follows:

$$\frac{\frac{dV_{off}}{dt}}{V_{off}(t=0)} = \frac{-0.0018\beta \cdot V_0(t=0)}{\beta \cdot V_0(t=0)} = -0.0018 \tag{9}$$

The total gain $\beta$ is eliminated from the equation (9). Thus, the equation (9) is established in any case with offset-voltage adjustments after gain adjustments even if the total gain $\beta$ varies.

[10] The right side of the equation (8) is calculated as follows:

$$-\frac{\frac{dV_{bias}}{dt}}{V_{bias}(t=0)} = \frac{\left(\frac{2 \cdot R_4}{R_3+R_4} - 1\right) \cdot \left(\frac{R_1}{R_1+R_2}\right) \cdot n \cdot \frac{dV_D}{dt}}{\left(\frac{2 \cdot R_4}{R_3+R_4} - 1\right) \cdot \left(V_{CC} - \frac{R_1}{R_1+R_2} \cdot n \cdot V_D(t=0)\right)} \tag{10}$$

[11] The left side and the right side of the equation (8) are replaced with the equations (9) and (10) as shown below, with Vcc=+12 volts and R1/(R1+R2)=A.

$$-0.0018 = -\frac{\frac{dV_{bias}}{dt}}{V_{bias}(t=0)} = \frac{A \cdot n \cdot \frac{dV_D}{dt}}{(12 - A \cdot n \cdot V_D(t=0))} \tag{11}$$

Moreover, the following equation (12) is established when the forward voltage Vd (t=0) of each diode is 0.6 volts and the temperature coefficient of each diode is $-2.0 \times 10^{-3}$.

$$A \times n = 7.013 \tag{12}$$

were A<1 and "n" is a natural number.

The following is one of the solutions of the equation (12).

Solution: A=0.876625 and n=8

Typically, the minimum value is selected for "n" in view of cost performance, diode voltage drop and freedom of power supply.

When $R2=\gamma R1$, the solution gives $\gamma=0.279$

The following resistor values are a practical combination for the resistors R1 and R2 when they are E24-serises resistors according to JIS (Japan Industrial Standard), which give the value nearest to the above value $\gamma$.

R1=430 Ω and R2=120 Ω

The resistor values for the resistors R3 and R4 are, for example, 50 kΩ or larger, larger than R1 and R2 in order of several figures to meet the requirements R3 and R4>>R and R2.

The resistor selection makes the currents flowing into and out from between the resistors R1 and R2 much smaller than the current flowing through each of these resistors, thus errors being negligible between the above solution and real operation of the current sensor.

What is claimed is:

1. A current sensor comprising:
   a Hall element;
   a differential amplifier to amplify an output voltage of the Hall element, thus producing a sensor output voltage; and
   a compensation circuit to compensate for variation in offset voltage of the current sensor, the compensation circuit having a plurality of series-connected diodes each exhibiting specific temperature characteristics based on a gradient of an approximated straight line given by a relationship between a residual Hall voltage of the Hall element at a given temperature and a rate of change in the residual Hall voltage due to temperature change, thus producing a compensation voltage in accordance with the temperature characteristics, the compensation voltage being added to the output voltage of the Hall element and input to the differential amplifier, wherein the series-connected diodes are divided into to a first diode group and a second diode group, the diode groups being connected in series in a forward bias direction via a resistor and having a specific same number of diodes connected in series in the forward bias direction, a resistor circuit being connected in parallel to the diode groups, the compensation voltage being output from the resistor circuit.

2. The current sensor according to claim 1, wherein the resistor circuit includes first and second resistors connected in series in the forward bias direction, third and fourth resistors connected in series in the forward bias direction and a fifth resistor, a terminal of the fifth resistor being connected to a connection point of the first and second resistors, another terminal of the fifth resistor being connected to a connection point of the third and fourth resistors, a voltage appearing at the fifth resistor being output as the compensation voltage, the first and second resistors being connected in parallel to the first diode group, the third and fourth resistors connected in parallel to the second diode group, the first and the fourth resistors being equal to each other in resistor value, the second and the third resistors being equal to each other in resistor value.

3. The current sensor according to claim 2, wherein the fifth resistor is a variable resistor adjustable for compensating for the variation in offset voltage of the current sensor with selection of the resistor value for the first and fourth resistors and also for the second and third resistors, a forward voltage of each diode or the number of the diodes in each diode group so that the sensor output voltage and the compensation voltage exhibit substantially same temperature characteristics.

4. The current sensor according to claim 2, wherein the fifth resistor consists of sixth and seventh resistors connected in series, the sixth and seventh resistors being larger than the first to the fourth resistors in resistor value, a temperature coefficient of a forward voltage of each diode being larger than a temperature coefficient of each resistor, variation in each resistor value due to temperature change being negligibly small.

* * * * *